(12) United States Patent
Pecheyran et al.

(10) Patent No.: US 6,928,021 B2
(45) Date of Patent: Aug. 9, 2005

(54) METHOD FOR THE PROGRAMMING OF AN ANTI-FUSE, AND ASSOCIATED PROGRAMMING CIRCUIT

(75) Inventors: Stéphane Pecheyran, Aix en Provence (FR); Jean-Michel Moragues, Saint Maximin (FR); Benjamin Duval, Saint Maximin (FR)

(73) Assignee: STMicroelectronics SA, Montrouge (FR)

( * ) Notice: Subject to any disclaimer, the term of this patent is extended or adjusted under 35 U.S.C. 154(b) by 178 days.

(21) Appl. No.: 10/638,949

(22) Filed: Aug. 11, 2003

(65) Prior Publication Data

US 2004/0071007 A1 Apr. 15, 2004

(30) Foreign Application Priority Data

Aug. 12, 2002 (FR) ............................................. 02 10195

(51) Int. Cl.[7] ................................................. G11C 7/00
(52) U.S. Cl. ....................................... 365/225.7; 365/96
(58) Field of Search ................................ 365/225.7, 96

(56) References Cited

U.S. PATENT DOCUMENTS

| | | | | |
|---|---|---|---|---|
| 5,276,653 A | * | 1/1994 | McKenny | ................ 365/225.7 |
| 5,563,549 A | * | 10/1996 | Shieh | ........................... 216/20 |
| 6,335,892 B1 | | 1/2002 | Shirley | ..................... 365/225.7 |
| 6,535,046 B2 | * | 3/2003 | Kaiser et al. | ................ 327/333 |
| 6,788,587 B2 | * | 9/2004 | Van De Graaff | ....... 365/189.05 |
| 2001/0026494 A1 | | 10/2001 | Marr et al. | ............... 365/225.7 |
| 2004/0065941 A1 | * | 4/2004 | Marr | ........................... 257/530 |

FOREIGN PATENT DOCUMENTS

| | | | | |
|---|---|---|---|---|
| JP | 2000299383 | 10/2000 | ........... H01L/21/82 |
| JP | 2001102456 | 4/2001 | ........... H01L/21/82 |

\* cited by examiner

*Primary Examiner*—Viet Q. Nguyen
(74) *Attorney, Agent, or Firm*—Lisa K. Jorgenson; Allen, Dyer, Doppelt, Milbrath & Gilchrist, P.A.

(57) ABSTRACT

An anti-fuse transistor includes a source, a drain and a well connected together, and a gate. A method for programming the anti-fuse transistor includes applying a reference potential to the gate, and applying a high potential greater than the reference potential to the drain of the anti-fuse transistor. A first access transistor is connected to the anti-fuse transistor. The first access transistor includes a drain connected to the source of the anti-fuse transistor, and a source for receiving the high potential. Applying the high potential to the drain of the anti-fuse transistor includes turning on the first access transistor.

22 Claims, 1 Drawing Sheet

METHOD FOR THE PROGRAMMING OF AN ANTI-FUSE, AND ASSOCIATED PROGRAMMING CIRCUIT

FIELD OF THE INVENTION

The present invention relates to a method for programming an anti-fuse and to an associated programming circuit. The present invention is applicable to electronic circuits in which an anti-fuse is used.

BACKGROUND OF THE INVENTION

An anti-fuse is a one-time programmable component equivalent to an open circuit by default when manufactured, and equivalent to a conductor when programmed. Anti-fuses are used in a very large number of applications. They can be used, for example, to customize a component when it comes off the production line, such as for the non-erasable storage of information (for example, an identifier code) in the component. They can also be used to adjust a variable (the value of a resistor, a voltage produced, etc.) of a component after a test phase.

As compared with an EEPROM type storage cell, which is another type of classic storage circuit, anti-fuses are appreciated especially for their non-erasable character, their small size and the fact that they can be read immediately because they do not necessitate the use of high voltage for this purpose as shall be seen further below.

An anti-fuse can be made as a capacitor. In one example (FIG. 1), an anti-fuse 100 is made in the form of a P-type transistor. The P-type transistor is made in an N-type well 101 and comprises a drain 102 and a source 103. The gate 104 is insulated from the well 101 and from the drain 102 and source 103 by an insulating thin oxide (silicon oxide) layer 105. The well 101, the drain 102 and the source 103 are taken to the same potential. The source and drain 102, 103 and the gate 104 respectively form the two electrodes of a capacitor whose insulator is formed by the thin gate oxide 105.

The anti-fuse shown in FIG. 1 is not programmed. Between the gate 104 and the source 103 (or the drain 102) of the transistor forming the anti-fuse 100 the impedance is infinite when the transistor is off (i.e., not conducting). The anti-fuse 100 is equivalent to an open circuit.

One known method to program an anti-fuse of this kind is to use what is known as the "breakdown by accumulation," that is, the gate oxide 105 is subjected to breakdown or disruption through the application of a high potential HT (about 10.5 V for an anti-fuse made with a gate oxide that is about 50 Angstroms thick) on the gate 104 while applying at the same time a reference potential (0 V) to the drain 102, the source 103 and the well 101. Thus, electrons are gradually attracted and distributed beneath the gate oxide 105. As a consequence, the field beneath the gate oxide is gradually augmented homogeneously between the drain and the source of the anti-fuse until the breakdown or disruption of the gate oxide 105 at a zone 106 located between the source and the drain of the anti-fuse 100. The gate oxide 105 becomes locally conductive at the disrupted zone. Between the gate 104 and the source 103 of the transistor, the impedance then becomes finite. The anti-fuse is now programmed.

To read the anti-fuse 100, i.e., to determine whether it is programmed or not, the impedance between the gate 104 and the source 103 of the transistor is measured. The reading can be done by applying a voltage between the gate 104 and the source 103 of the transistor forming the anti-fuse 100 and by measuring the current flowing between the gate and the source. The reading can also be done by imposing a current between the gate 104 and the source 103 of the transistor 100 and by measuring the voltage between the gate and the source.

The known programming method has certain drawbacks because the impedance obtained after programming between the gate 104 and the source 103 of the transistor 100 forming the anti-fuse is highly variable, and is therefore, difficult to measure. The impedance of the programmed anti-fuse 100 is indeed highly non-linear (represented by a solid-line curve shown in FIG. 2). It varies non-negligibly with the voltage applied between the gate 104 and the source 103 of the anti-fuse transistor 100. Behavior of this kind for an impedance is typical of a P/N junction which characterizes the contact between the N-type well 101 and the P-type gate 104 at the position at which the insulating oxide 105 has been disrupted.

When the voltage VG between the gate 104 and the source 103 is low, such as between −1 and 1 V, the impedance is infinite (including when the anti-fuse 100 is programmed) and the impedance is not detectable. It is therefore necessary to have a minimal voltage of about 1 V to find out if the anti-fuse 100 is programmed or not. This entails a relative constraint, especially for circuits that are made by the more advanced technologies and use power supply voltages in the range of 1 V.

The impedance of the programmed anti-fuse 100 also varies greatly with the temperature of the component. The current or voltage to be detected between the gate 104 and the source 103 of the programmed anti-fuse 100 in order to measure the impedance varies with temperature. A read circuit capable of detecting temperature-variable currents or voltages of this kind is especially difficult to make.

Finally, the impedance of the programmed anti-fuse 100 varies greatly from one component to another in the same production line. It is still difficult to make read circuits that operate over a wide range of currents or voltages.

SUMMARY OF THE INVENTION

In view of the foregoing background, an object of the present invention is to resolve the above-mentioned problems by providing a method and an associated circuit for the programming of an anti-fuse, which results in an anti-fuse having a very high resistive impedance when programmed.

This and other objects, advantages and features in accordance with the present invention are provided by a method for programming an anti-fuse transistor comprising a drain, a source and a well connected together, and a gate. A reference potential is applied to the gate of the anti-fuse transistor and a high potential is applied to the drain of the anti-fuse transistor. In other words, to program the anti-fuse transistor, a voltage is applied between the gate and the source (which is connected to the drain and to the well) of the anti-fuse transistor. This voltage is the reverse of the voltage applied according to the known programming method of the prior art. The high potential is a programming potential greater than the power supply potential of the circuit.

With the present invention, as shall be seen more clearly below, and contrary to the prior art programming method, the thin oxide layer is disrupted at the level of the source and the drain of the anti-fuse transistor. Thus, after the breakdown of the oxide, the gate and the source are locally in contact. Similarly, the gate and the drain are also in contact. Since the drain, the source and the gate are made of the same material, the contacts obtained after programming are resistive, and are therefore especially independent of the voltage between the gate and the source. The resulting impedance is far easier to detect.

Preferably, to apply the high potential to the drain of the anti-fuse transistor, a first access transistor is turned on, and the drain of this access transistor is connected to the drain of the anti-fuse transistor. The high potential is applied to the source of the first access transistor. Thus, the high potential is applied to the drain of the anti-fuse transistor only when a programming is desired, and the anti-fuse transistor is insulated from the high potential if no other programming is in progress.

The present invention also relates to a circuit comprising an anti-fuse transistor comprising a drain, a source and a well connected together, and a gate. The circuit may further comprise a first access transistor comprising a source to which a high potential is applied and a drain connected to the source of the anti-fuse transistor. A reference potential, less than the high potential, is applied on the gate of the anti-fuse transistor. The circuit may also comprise a second access transistor comprising a drain connected to the gate of the anti-fuse transistor, and a source to which a reference potential is applied.

BRIEF DESCRIPTION OF THE DRAWINGS

The present invention and the advantages that flow from it shall be seen more clearly from the following description of exemplary embodiments of an anti-fuse circuit and exemplary modes of implementation of the method according to the present invention. The description is made with reference to the appended drawings, of which.

DETAILED DESCRIPTION OF THE PREFERRED EMBODIMENTS

Figure 1:
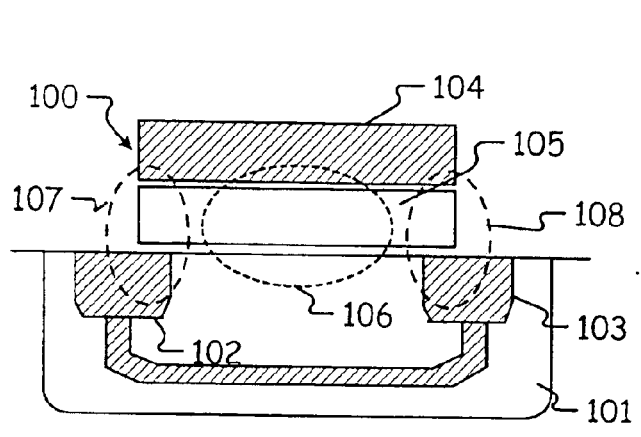
FIG. 1 is a cross-sectional view of an anti-fuse made using CMOS technology according to the prior art.
Figure 3:
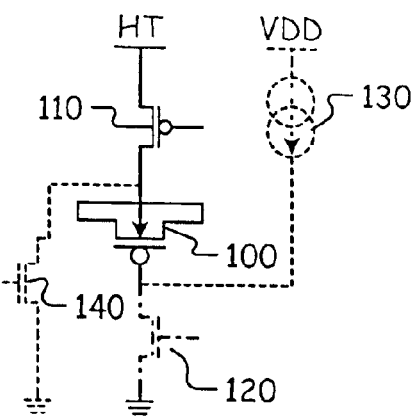
FIG. 3 is an electronic diagram of an anti-fuse circuit according to the present invention.

The anti-fuse transistor 100 of FIG. 1 is shown in another form in FIG. 3. The transistor 100 has a gate to which a reference potential VSS is applied. The transistor 100 also has a drain, a source and a well all connected together to a drain of a first access transistor 110. According to the invention, a high potential HT is applied to the source of the transistor 110 and an enabling signal PROG (not shown in the figures) is applied to the gate of the transistor 110. In one example, the potential HT is equal to 10.5 V for an anti-fuse made with a gate oxide that is 50 Angstroms thick.

The circuit of FIG. 3 is used to program the anti-fuse 100 by achieving, according to the invention, a negative gate oxide 105. The high potential HT is applied to the source of the transistor 100 when it is on, and its drain 102 and source 103 are at the reference potential. Since the gate of the transistor 100 is connected to ground, a high difference in potential (or voltage) appears between, first, the gate 104 of the anti-fuse 100, and second, its drain 102 and its source 103. Since the well 101 is at the reference potential and the gate 104 is at the high potential HT, the holes, which are in the majority, are pushed back to the well and a light inversion layer appears, which is distributed beneath the oxide layer 105. The regions with the highest doping in holes are the drain 102 and the source 103 of the anti-fuse transistor 100. Thus, the electrical field increases more strongly at the zones 107, 108 shown in dashes in FIG. 1, which are close to the drain 102 and source 103 of the anti-fuse 100.

When the field reaches a sufficient value at the zones 107, 108, the gate oxide 105 is disrupted, preferably at the zones where the field is the strongest, namely at the level of the zones 107, 108. After breakdown, the gate 104, made of P+ polysilicon, comes into contact with the lower layer, at the level where the gate oxide 105 is disrupted. Here it is at the drain 102 and the source 103, made of P+ polysilicon. Since the gate 104 and drain 102 and/or source 103 in contact with one another are of the same type, the behavior of the junction thus formed is of the resistive type. This results in a resistive behavior of the impedance of the programmed anti-fuse.

Figure 2:
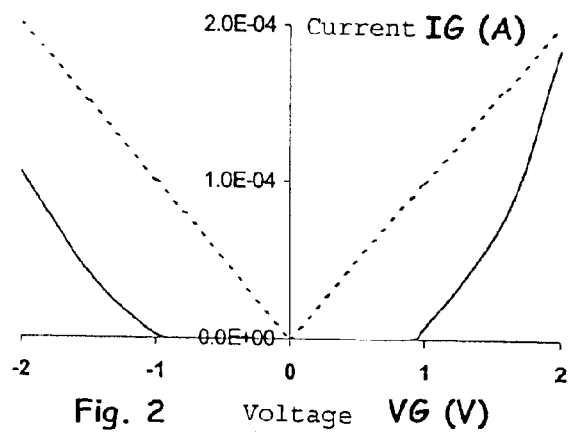
FIG. 2 is a graph showing the voltage versus current changes at the terminals of a programmed anti-fuse according to the present invention.

Such a resistive impedance is, of course, far easier to detect than the impedance of an anti-fuse programmed according to the known prior art methods. Indeed, a resistive impedance such as the one obtained by programming according to the invention has the advantage of being independent of the voltage. The curve showing the progress of the current flowing between the gate and the source of the anti-fuse transistor as a function of the voltage between the gate and the source is therefore linear (see dashed curve in FIG. 2). A resistive impedance of this kind furthermore has the advantage of being far less sensitive to temperature and to variations in the manufacturing method. It is therefore far easier to detect a resistive impedance of this kind, including low measurement voltages between the gate and the source of the anti-fuse.

The circuit of FIG. 3 is advantageously complemented by a second access transistor 120 (shown in dots and dashes in FIG. 2), whose drain and source are connected between the gate of the transistor 100 and ground. The transistor 120 insulates the anti-fuse 100 from ground outside the time of its programming. The transistor 120 is turned on at the same time as the transistor 110.

The circuit comprising the anti-fuse 100 is also advantageously complemented by elements by which the anti-fuse can be read, at any time. According to a first embodiment shown in FIG. 3, the circuit also comprises a current source 130 and a third access transistor 140 (shown in dashes in FIG. 3). The current source 130 comprises a pole connected to the gate of the anti-fuse transistor 100, and another pole to which a power supply potential VDD is applied. The drain and the source of the transistor 140 are respectively connected to the source of the anti-fuse 100 and to ground. The transistor 140 is controlled by a read signal READ (not shown in the figures). The elements 130, 140 enable the anti-fuse 100 to be read in a state of accumulation. When the READ signal is active, the transistor 140 is on, and the current IG produced by the current source 130 flows between the gate and the source of the anti-fuse.

A measurement of the voltage VG between the gate and the source of the anti-fuse 100 enables its impedance to be obtained immediately: ZG=VG/IG. If this impedance is infinite, then the anti-fuse is not programmed. Inversely, if this impedance is finite, then the anti-fuse is programmed.

One of the advantages of an anti-fuse as compared with a storage circuit such as an EEPROM circuit can be noted here. The power supply potential VDD of the circuit is sufficient to read the anti-fuse. For example, VDD=1.65 V for a circuit made using 0.18 µm technology. It is not necessary to have a higher potential available.

Figure 4:
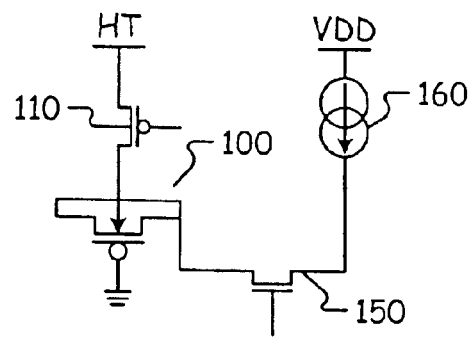
FIGS. 4 to 6 are variations of the anti-fuse circuit illustrated in FIG. 3.
Figure 5:
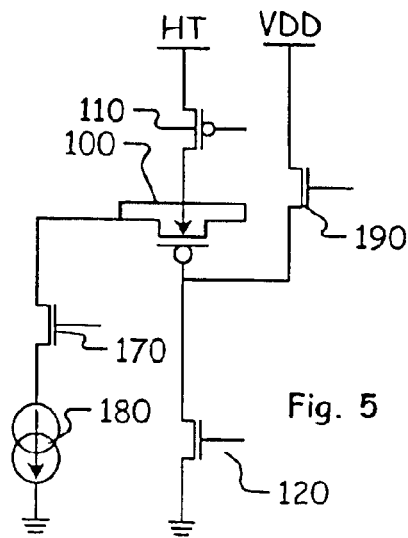
Figure 6:
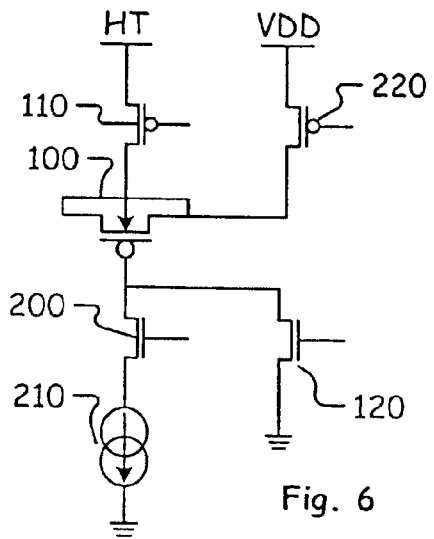

FIGS. 4 to 6 show variations of FIG. 3. All these circuits operate similarly. All have an anti-fuse 100, means for programming it and means for reading. According to the invention, the programming is done in negative breakdown, with the transistors 110, 120.

In FIG. 4, to read the anti-fuse, the invention uses an access transistor 150 and a current source 160 series-connected between the source of the anti-fuse 100 and the source of power supply potential VDD. The gate of the anti-fuse is connected to ground. The transistor 110 is turned on by the programming signal PROG (not shown in the figures) when a programming of the anti-fuse transistor 100 is desired. The transistor 150 is turned on by the read signal READ when a reading is desired. The circuit of FIG. 4 carries out a reading in negative breakdown.

In FIG. 5, to read the anti-fuse 100, the invention uses an access transistor 170 and a current source 180 series-connected between the source of the anti-fuse and the ground. The invention also uses an access transistor 190 connected between the gate of the anti-fuse 100 and the source providing the power supply potential VDD. The transistors 170, 190 are turned on by the read signal READ when a reading is desired. The access transistors 170, 190 insulate the anti-fuse from ground and the potential VDD source when no reading is planned. Thus, reading in conditions of charge accumulation is done.

Finally, in FIG. 6, to read the anti-fuse 100, the invention uses an access transistor 200 and a current source 210 series-connected between the source of the anti-fuse and ground. The invention also uses an access transistor 220 connected between the source of the anti-fuse 100 and the source providing the power supply potential VDD. The transistors 110, 120 are turned on when a programming of the anti-fuse 100 is desired. The transistors 210, 220 are turned on when a read operation is desired. Thus, a read operation in negative breakdown in performed.

That which is claimed is:

1. A method for programming an anti-fuse transistor comprising a drain, a source and a well connected together, and a gate, the method comprising:
   applying a reference potential to the gate of the anti-fuse transistor; and
   applying a high potential greater than the reference potential to the drain of the anti-fuse transistor.

2. A method according to claim 1, wherein a first access transistor is connected to the anti-fuse transistor, the first access transistor comprising a drain connected to the source of the anti-fuse transistor and a source for receiving the high potential; and wherein applying the high potential comprises turning on the first access transistor.

3. A method according to claim 1, wherein a second access transistor is connected to the anti-fuse transistor, the second access transistor comprising a drain connected to the gate of the anti-fuse transistor and a source for receiving the reference potential; and wherein applying the reference potential comprises turning on the second access transistor.

4. A method according to claim 1, wherein a a first current source and a third access transistor are connected to the anti-fuse transistor, the first current source having a first terminal connected to the gate of the anti-fuse transistor and a second terminal for receiving a power supply potential, the third access transistor comprising a drain connected to the source of the anti-fuse transistor and a source for receiving the reference potential and a gate; and further comprising determining a programming state of the anti-fuse transistor by applying a read signal to the gate of the third access transistor.

5. A method according to claim 1, wherein a second current source and a fourth access transistor are connected to the anti-fuse transistor, the fourth access transistor comprising a source connected to the source of the anti-fuse transistor and a drain and a gate, the second current source having a first terminal connected to the drain of the fourth access transistor and a second terminal for receiving a power supply potential; and further comprising determining a programming state of the anti-fuse transistor by applying a read signal to the gate of the fourth access transistor.

6. A method according to claim 1, wherein a third current source, a fifth access transistor and a sixth access transistor are connected to the anti-fuse transistor, the fifth access transistor comprising a drain connected to the source of the anti-fuse transistor and a source and a gate, the third current source having a first terminal connected to the source of the fifth access transistor and a second terminal for receiving the reference potential, and the sixth access transistor comprising a source connected to the gate of the anti-fuse transistor and a drain for receiving a power supply potential and a gate; and further comprising determining a programming state of the anti-fuse transistor by applying a read signal to the gates of the fifth and sixth access transistors.

7. A method according to claim 1, wherein a fourth current source, a seventh access transistor and an eighth access transistor are connected to the anti-fuse transistor, the seventh access transistor comprising a drain connected to the gate of the anti-fuse transistor and a source and a gate, the fourth current source having a first terminal connected to the source of the seventh access transistor and a second terminal for receiving the reference potential, and an eighth access transistor comprising a source connected to the source of the anti-fuse transistor and a drain for receiving a power supply potential; and further comprising determining a programing state of the anti-fuse transistor by applying a read signal to the gates of the seventh and eighth access transistors.

8. A method for programming an anti-fuse transistor comprising a first conduction terminal, a second conduction terminal and a well connected together, and a control terminal, the method comprising:
   determining a programming state of the anti-fuse transistor, and if the anti-fuse transistor has not been programmed, then
      applying a reference potential to the control terminal of the anti-fuse transistor, and
      applying a high potential greater than the reference potential to the first conduction terminal of the anti-fuse transistor.

9. A method according to claim 8, wherein the anti-fuse transistor comprises a MOSFET, and wherein the first conduction terminal defines a drain, the second conduction terminal defines a source and the control terminal defines a gate of the MOSFET.

10. A method according to claim 8, wherein a first access transistor is connected to the anti-fuse transistor, the first access transistor comprising a first conduction terminal connected to the second conduction terminal of the anti-fuse transistor and a second conduction terminal for receiving the high potential; and wherein applying the high potential comprises turning on the first access transistor.

11. A method according to claim 8, wherein a second access transistor is connected to the anti-fuse transistor, the second access transistor comprising a first conduction terminal connected to the control terminal of the anti-fuse transistor and a second conduction terminal for receiving the reference potential; and wherein applying the reference potential comprises turning on the second access transistor.

12. A method according to claim 8, wherein a a first current source and a third access transistor are connected to the anti-fuse transistor, the first current source having a first terminal connected to the control terminal of the anti-fuse transistor and a second terminal for receiving a power supply potential, the third access transistor comprising a first conduction terminal connected to the second conduction terminal of the anti-fuse transistor and a second conduction terminal for receiving the reference potential and a control terminal; and wherein determining the programming state of the anti-fuse transistor comprises applying a read signal to the control terminal of the third access transistor.

13. A method according to claim 8, wherein a second current source and a fourth access transistor are connected to the anti-fuse transistor, the fourth access transistor comprising a second conduction terminal connected to the second conduction terminal of the anti-fuse transistor and a first conduction terminal and a control terminal, and the second current source having a first terminal connected to the first conduction terminal of the fourth access transistor, and a second terminal for receiving a power supply potential; and wherein determining the programming state of the anti-fuse transistor comprises applying a read signal to the control terminal of the fourth access transistor.

14. A method according to claim 8, wherein a third current source, a fifth access transistor and a sixth access transistor are connected to the anti-fuse transistor, the fifth access transistor comprising a first conduction terminal connected to the second conduction terminal of the anti-fuse transistor and a second conduction terminal and a control terminal, the third current source having a first terminal connected to the second conduction terminal of the fifth access transistor and a second terminal for receiving the reference potential, and the sixth access transistor comprising a second conduction terminal connected to the control terminal of the anti-fuse transistor and a first conduction terminal for receiving a power supply potential and a control terminal; and wherein determining the programming state of the anti-fuse transistor comprises applying a read signal to the control terminals of the fifth and sixth access transistors.

15. A method according to claim 8, wherein a fourth current source, a seventh access transistor and an eighth access transistor are connected to the anti-fuse transistor, the seventh access transistor comprising a first conduction terminal connected to the control terminal of the anti-fuse transistor and a second conduction terminal and a control terminal, the fourth current source having a first terminal connected to the second conduction terminal of the seventh access transistor and a second terminal for receiving the reference potential, and an eighth access transistor comprising a second conduction terminal connected to the second conduction terminal of the anti-fuse transistor and a first conduction terminal for receiving a power supply potential; and wherein determining the programming state of the anti-fuse transistor comprises applying a read signal to the control terminals of the seventh and eighth access transistors.

16. A circuit comprising:
  an anti-fuse transistor comprising a drain, a source and a well connected together, and a gate; and
  a programming circuit connected to said anti-fuse transistor for applying a reference potential to the gate of said anti-fuse transistor, and for applying a high potential greater than the reference potential to the drain of said anti-fuse transistor.

17. A circuit according to claim 16, wherein said programming circuit comprises a first access transistor connected to the anti-fuse transistor, said first access transistor comprising a drain connected to the source of said anti-fuse transistor and a source for receiving the high potential; and wherein said programming circuit applies the high potential by turning on said first access transistor.

18. A circuit according to claim 16, wherein said programming circuit comprises a second access transistor comprising a drain connected to the gate of said anti-fuse transistor and a source for receiving the reference potential; and wherein said programming circuit applies the reference potential by turning on said second access transistor.

19. A circuit according to claim 16, further comprising a reading circuit connected to said anti-fuse transistor and comprising:
  a first current source having a first terminal connected to the gate of said anti-fuse transistor, and a second terminal for receiving a power supply potential; and
  a third access transistor comprising a drain connected to the source of said anti-fuse transistor, and a source for receiving the reference potential.

20. A circuit according to claim 16, further comprising a reading circuit connected to said anti-fuse transistor and comprising:
  a fourth access transistor comprising a source connected to the source of said anti-fuse transistor, and a drain; and
  a second current source having a first terminal connected to the drain of said fourth access transistor, and a second terminal for receiving a power supply potential.

21. A circuit according to claim 16, further comprising a reading circuit connected to said anti-fuse transistor and comprising:
  a fifth access transistor comprising a drain connected to the source of said anti-fuse transistor;
  a third current source having a first terminal connected to the source of said fifth access transistor, and a second terminal for receiving the reference potential; and
  a sixth access transistor comprising a source connected to the gate of said anti-fuse transistor, and a drain for receiving a power supply potential.

22. A circuit according to claim 16, further comprising a reading circuit connected to said anti-fuse transistor and comprising:
  a seventh access transistor comprising a drain connected to the gate of said anti-fuse transistor, and a source;
  a fourth current source having a first terminal connected to the source of said seventh access transistor, and a second terminal for receiving the reference potential; and
  an eighth access transistor comprising a source connected to the source of said anti-fuse transistor, and a drain for receiving a power supply potential.

* * * * *